United States Patent
Chang

(10) Patent No.: US 11,830,801 B2
(45) Date of Patent: Nov. 28, 2023

(54) CHIP-ON-FILM PACKAGE AND SEMICONDUCTOR CHIP EACH HAVING A READOUT CIRCUIT FOR A TOUCH DRIVING SIGNAL AND A SOURCE CHANNEL CIRCUIT FOR OUTPUTTING A PIXEL DRIVING SIGNAL

(71) Applicant: LX Semicon Co., Ltd., Daejeon (KR)

(72) Inventor: Young Uk Chang, Daejeon (KR)

(73) Assignee: LX SEMICON CO., LTD., Daejeon (KR)

(*) Notice: Subject to any disclaimer, the term of this patent is extended or adjusted under 35 U.S.C. 154(b) by 81 days.

(21) Appl. No.: 17/527,119

(22) Filed: Nov. 15, 2021

(65) Prior Publication Data
US 2022/0199512 A1 Jun. 23, 2022

(30) Foreign Application Priority Data
Dec. 17, 2020 (KR) .................. 10-2020-0177073

(51) Int. Cl.
*H01L 23/498* (2006.01)
*H01L 23/31* (2006.01)
*H01L 23/50* (2006.01)

(52) U.S. Cl.
CPC ........ *H01L 23/49838* (2013.01); *H01L 23/31* (2013.01); *H01L 23/49866* (2013.01)

(58) Field of Classification Search
None
See application file for complete search history.

(56) References Cited

U.S. PATENT DOCUMENTS

| 9,922,921 | B2 | 3/2018 | Jung et al. | |
|---|---|---|---|---|
| 2015/0311148 | A1 | 10/2015 | Jung et al. | |
| 2020/0034020 | A1* | 1/2020 | Lee | G06F 3/04164 |
| 2021/0141478 | A1* | 5/2021 | Oh | G02F 1/13338 |
| 2021/0191555 | A1* | 6/2021 | Jo | G09G 3/3685 |
| 2021/0191561 | A1* | 6/2021 | Kim | G06F 3/0441 |

FOREIGN PATENT DOCUMENTS

| KR | 10-2016-0126765 A | 11/2016 |
|---|---|---|
| KR | 101723879 B1 | 4/2017 |
| KR | 10-2018-0025774 A | 3/2018 |
| KR | 10-2019-0032097 A | 3/2019 |
| KR | 102252380 B1 | 5/2021 |

* cited by examiner

*Primary Examiner* — Michael Jung
(74) *Attorney, Agent, or Firm* — ROTHWELL, FIGG, ERNST & MANBECK, P.C.

(57) ABSTRACT

The present disclosure relates to a chip on film package, in which communication wires for communication with a control circuit are disposed to traverse a semiconductor chip thereunder so as to simplify the wiring inside the semiconductor chip.

15 Claims, 4 Drawing Sheets

CHIP-ON-FILM PACKAGE AND SEMICONDUCTOR CHIP EACH HAVING A READOUT CIRCUIT FOR A TOUCH DRIVING SIGNAL AND A SOURCE CHANNEL CIRCUIT FOR OUTPUTTING A PIXEL DRIVING SIGNAL

CROSS REFERENCE TO RELATED APPLICATION

This application claims priority from Republic of Korea Patent Application No. 10-2020-0177073, filed on Dec. 17, 2020, which is hereby incorporated by reference in its entirety.

BACKGROUND

1. Field of Technology

The present disclosure relates to a semiconductor chip package disposed on a film.

2. Description of the Prior Art

A chip on film (COF) method is a technology in which a semiconductor chip is mounted on a printed circuit substrate in a form of a film.

The COF method is a technology of mounting a semiconductor chip using an anisotropic conductive film or solder bumps on a polyimide film on which circuits are engraved. Since this technology allows the downsizing of a semiconductor chip and materials used for this technology are flexible, this is suitable to producing a light, thin, short, and small package.

However, a semiconductor chip mounted on a film in the COF method becomes multi-functionalized and the routing becomes problematic.

Recently, a semiconductor chip is designed to perform a function as a source driver concurrently with a function as a readout circuit. For this reason, the number of wires connected to the semiconductor increases. It is a key task to efficiently route such wires without them overlapping.

SUMMARY OF THE INVENTION

In this background, an aspect of the present disclosure is to efficiently route wires to be disposed on a film of a chip on film package.

To this end, in an aspect, the present disclosure provides a chip on film package, having a first side through which a communication signal is transmitted and a second side, opposite the first side, through which a driving signal is outputted, comprising: a semiconductor chip comprising a readout circuit to output a touch driving signal, a source channel circuit to output a pixel driving signal, a readout communication pad formed on the first side, and a source communication pad formed on the second side; and a chip on film on which a readout communication wire, connected with the readout communication pad to transmit a readout communication signal, and a source communication wire, connected with the source communication pad to transmit a source communication signal, are disposed, wherein the source communication wire is disposed to traverse an area, where the semiconductor chip is disposed, from the first side to the second side.

On the chip on film, the readout communication wire, the source communication wire, a touch driving wire, and a pixel driving wire may be disposed on a same layer.

In another aspect, the present disclosure provides a semiconductor chip, which performs a communication using a readout communication wire and a source communication wire extended from a first side and outputs a driving signal to a second side opposite the first side, comprising: a readout communication pad disposed on the first side and connected with the readout communication wire; a source communication pad disposed on the second side and connected with the source communication wire extended from the first side to the second side in a state of being insulated from a lower surface of the semiconductor chip; a readout circuit disposed to be adjacent to the readout communication pad; and a source channel circuit disposed to be adjacent to the source communication pad.

As described above, the present disclosure allows an efficient routing of wires disposed on a film of a chip on film package.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION OF THE EXEMPLARY EMBODIMENTS

Figure 1:
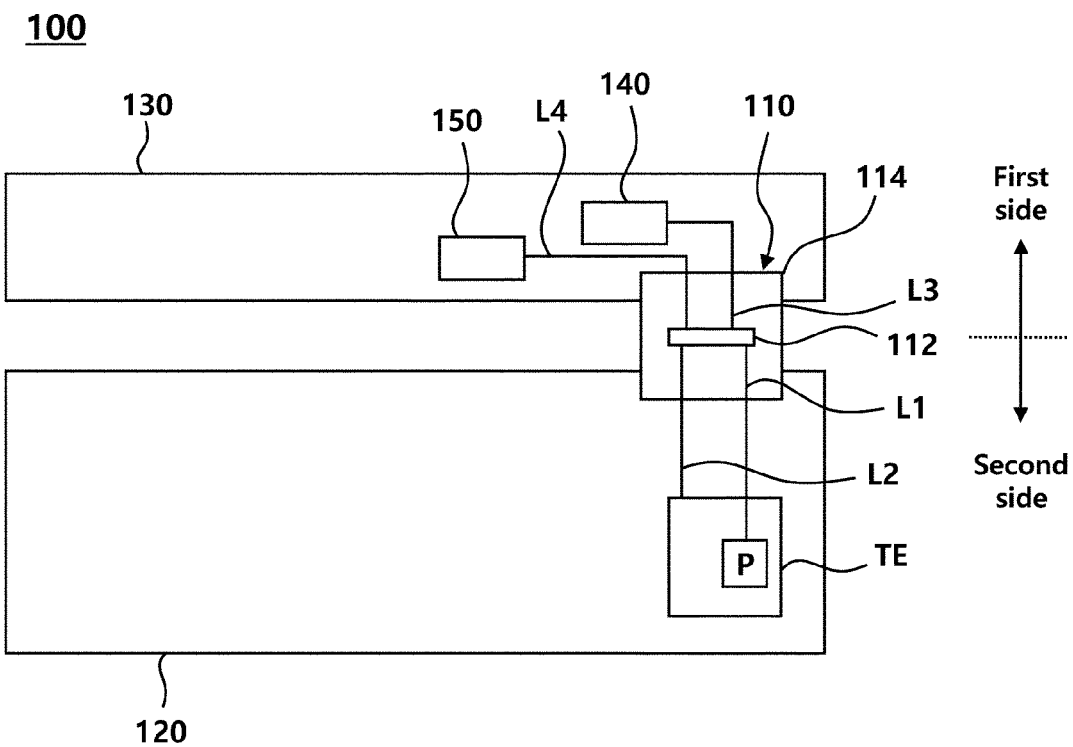
FIG. 1 is a configuration diagram of a display device according to an embodiment.

FIG. 1 is a configuration diagram of a display device according to an embodiment.

Referring to FIG. 1, a display device 100 may comprise a chip on film package 110, a display panel 120, and a circuit board 130.

The display device 100 may comprise a plurality of pixels P and control circuits for driving pixels P. The plurality of pixels P may be disposed on the display panel 120 and the control circuits may be disposed on the chip on film package 110 and the circuit board 130.

On the display panel 120, a plurality of data lines and gate lines are disposed and pixels P may be defined by intersections of the data lines and the gate lines. The brightness of a pixel P may be determined by a pixel driving signal (for example, a data voltage) supplied through a data line and such pixel driving signals may be supplied by source channel circuits of the semiconductor chip 112 disposed in the chip on film package.

A source channel circuit may generate a pixel driving signal to drive a pixel of the display panel 120 and a pixel driving signal may be generated according to image data received from a timing controller 140. Image data may include a digital value indicating the brightness of each pixel P and the source channel circuit may convert such a digital value into an analog signal—a pixel driving signal—and output the analog signal to the display panel 120.

The semiconductor chip 112 may comprise a first line L1 and a third line L3 respectively for outputting a pixel driving signal to the display panel and for receiving image data from the timing controller 140 disposed on the circuit board 130.

The display device 100 may comprise a plurality of touch electrodes TE and other control circuits to drive touch electrodes TE. The plurality of touch electrodes TE may be disposed on the display panel 120 and the other control circuits may be disposed on the chip on film package 110 and the circuit board 130.

On the display panel 120, a plurality of sensing lines may be disposed and sensing lines may be connected with touch electrodes TE. A touch electrode TE may be driven by a touch driving signal and such a touch driving signal may be supplied by a readout circuit of the semiconductor chip 112 disposed on the chip on film package.

The readout circuits may generate touch driving signals for driving touch electrodes TE of the display panel 120 and generate sensing data by sensing touch electrodes TE. The readout circuits may generate touch data including touch coordinates using the sensing data and transmit the touch data to a touch controller 150 disposed on the circuit board 130.

The semiconductor chip 112 may comprise a second line L2 and a fourth line L4 respectively for outputting a touch driving signal to the display panel 120 and transmitting touch data to the touch controller 150 disposed on the circuit board 130.

Referring to connection, the chip on film package 110, on which the semiconductor chip 112 is disposed, may be connected with the display panel 120 on a second side and with the circuit board 130 on a first side.

Meanwhile, as described above, the semiconductor chip 112 may perform two or more functions—a pixel driving, a touch electrode driving, etc.—and be connected with two or more wires. Here, it is important that the wires do not overlap and are efficiently routed.

In addition, since the semiconductor chip 112 performs two or more functions, the internal heat value increases. Therefore, it is also important to efficiently discharge such heat.

According to an embodiment, the chip on film package may provide a solution for the above-described matters through a new method for the arrangement of internal circuits and a new method for the wire routing.

Figure 2:
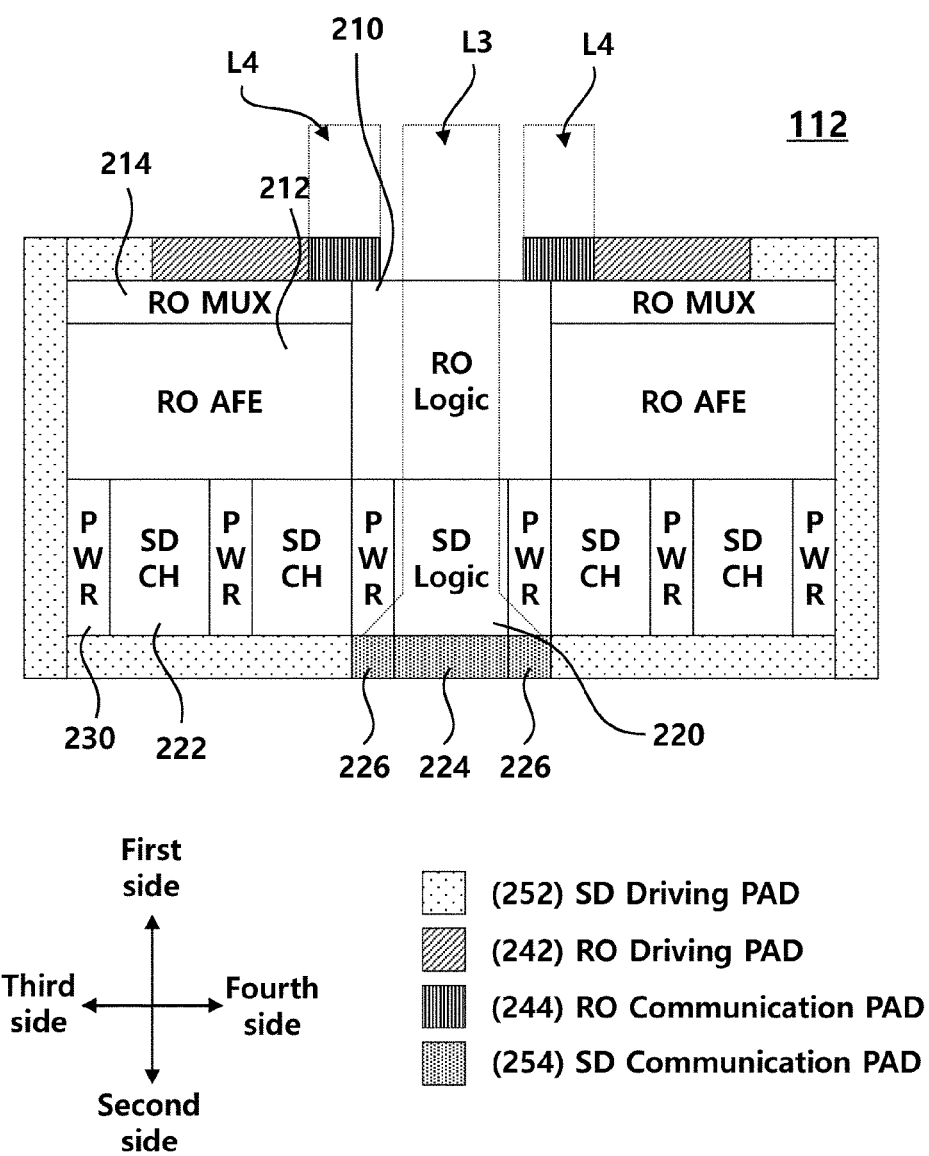
FIG. 2 is a plan view of an arrangement of circuits and pads of a semiconductor according to an embodiment.

FIG. 2 is a plan view of an arrangement of circuits and pads of a semiconductor according to an embodiment.

Referring to FIG. 2, the semiconductor chip 112 may comprise a readout block and a source channel block.

The readout block may comprise readout circuits 212 (readout analog-front-end, RO AFE), a readout logic circuit 210, and readout multiplexer (MUX) circuits 214 and the source channel block may comprise source channel circuits 222, a source logic circuit 220, and power circuits 230.

In a plan view, the readout block may be disposed on a first side and the source channel block may be disposed on a second side. In FIG. 2, the first side may be where communication signals are transmitted and received and directed toward the circuit board 130 and the second side may be where driving signals are outputted and directed toward the display panel. For the convenience of description, in FIG. 2, the left side is defined as a third side and the right side is defined as a fourth side.

In such a way, the readout block may be disposed to be adjacent to the circuit board and the source channel block may be disposed to be adjacent to the display panel.

The readout block may transmit and receive readout communication signals through readout communication pads 244. A readout communication signal is to communicate with the touch controller on the circuit board. It may comprise touch data.

The readout communication pads 244 may be disposed adjacent to the readout logic circuit 210 in the readout block and on the first side on the edge of the semiconductor chip 112.

The readout communication pads 244 may be connected with readout communication wires L4. The readout communication wires L4 may be extended from the circuit board disposed on the first side to the readout communication pads 244.

The readout block may output touch driving signals through readout driving pads 242.

The readout driving pads 242 may be disposed to be adjacent to the readout circuits 212 in the readout block and on the first side on the edge of the semiconductor chip 112.

The readout driving pads 242 may be connected with touch driving wires. The touch driving wires may be extended from the display panel disposed on the second side to the readout driving pads 242. Here, since the readout driving pads 242 are disposed on the first side of the semiconductor chip 112, the touch driving wires may be extended along the edge of the semiconductor chip 112 to the second side.

From a view of the direction of the third and the fourth sides, the readout logic circuit 210 may be disposed in the middle of the readout block and the readout circuits 212 may be disposed respectively on the third side and the fourth side with respect to the readout logic circuit 210.

The readout block may further comprise the readout MUX circuits 214. A readout MUX circuit 214 may selectively connect a readout driving pad 242 to a readout circuit 212.

The readout communication wires L4 are divided into two, and one is connected with a readout communication pad 244 on the third side and the other is connected with a readout communication pad 244 on the fourth side.

Between the readout communication wires L4 divided into two, source communication wires L3 may be disposed.

The source communication wires L3 may transmit and receive source communication signals and a source communication signal may be, for example, a signal to communicate with the timing controller on the circuit board and comprise image data.

The source communication wires L3 may be disposed to traverse the semiconductor chip from the first side to the second side. In addition, the source communication wires L3 may be connected with source communication pads 254 on the second side on the edge of the semiconductor chip 112.

According to the conventional arts, the source communication wires are connected with the source communication pads disposed on the first side on the edge of the semiconductor chip and wires inside the semiconductor chip connect the source logic circuit and the source communication pads disposed on the second side. However, such a structure has the problems that the size of a chip increases due to the internal wires, it is difficult to remove internal heat, and the routing of the internal wires is complicated.

According to an embodiment, on the contrary, since the source communication wires L3 are disposed outside the semiconductor chip and extended from outside the semiconductor toward the second side, the aforementioned problems do not occur.

The source communication wires L3 being extended to the second side as described above mostly come from the source logic circuit 220 being disposed on the second side of the semiconductor chip 112.

The source channel block may be disposed to be adjacent to the display panel. Therefore, the source logic circuit 220 may be disposed in the middle in the second side of the semiconductor chip 112. The source channel circuits 222 and the power circuits 230 may be disposed respectively on the third side and the fourth side with respect to the source logic circuit 220.

The source channel circuits 222 may transmit and receive source communication signals through the source communication wires L3 connected with the source communication pads 254.

The source communication pads 254 may be disposed to be adjacent to the source logic circuit 220 and on the second side on the edge of the semiconductor chip 112.

The source communication pads 254 may comprise gamma voltage pads 226 and embedded clock communication pads 226. The source channel circuits 222 may receive a plurality of gamma voltages through the gamma voltage pads 226. Source communication wires transmitting gamma voltages may be referred to as gamma voltage wires.

The source logic circuit 220 may receive differential signals, into which clocks are embedded, through the embedded clock communication pads 224. Here, the source communication wires transmitting the differential signals may be comprised of positive signal wires and negative signal wires. Depending on embodiments, only the positive signal wires and the negative signal wires may be referred to as the source communication wires and the gamma voltage wires may be referred to otherwise.

The source driving pads 252 may be connected with pixel driving wires. The pixel driving wires may be extended from the display panel disposed on the second side to the source driving pads 252.

Since the source driving pads 252 are numerous, they may be disposed on the second side, the third side, the fourth side, and parts of the first side on the edge of the semiconductor chip 112.

The aforementioned wires may be formed on the chip on film.

Figure 3:
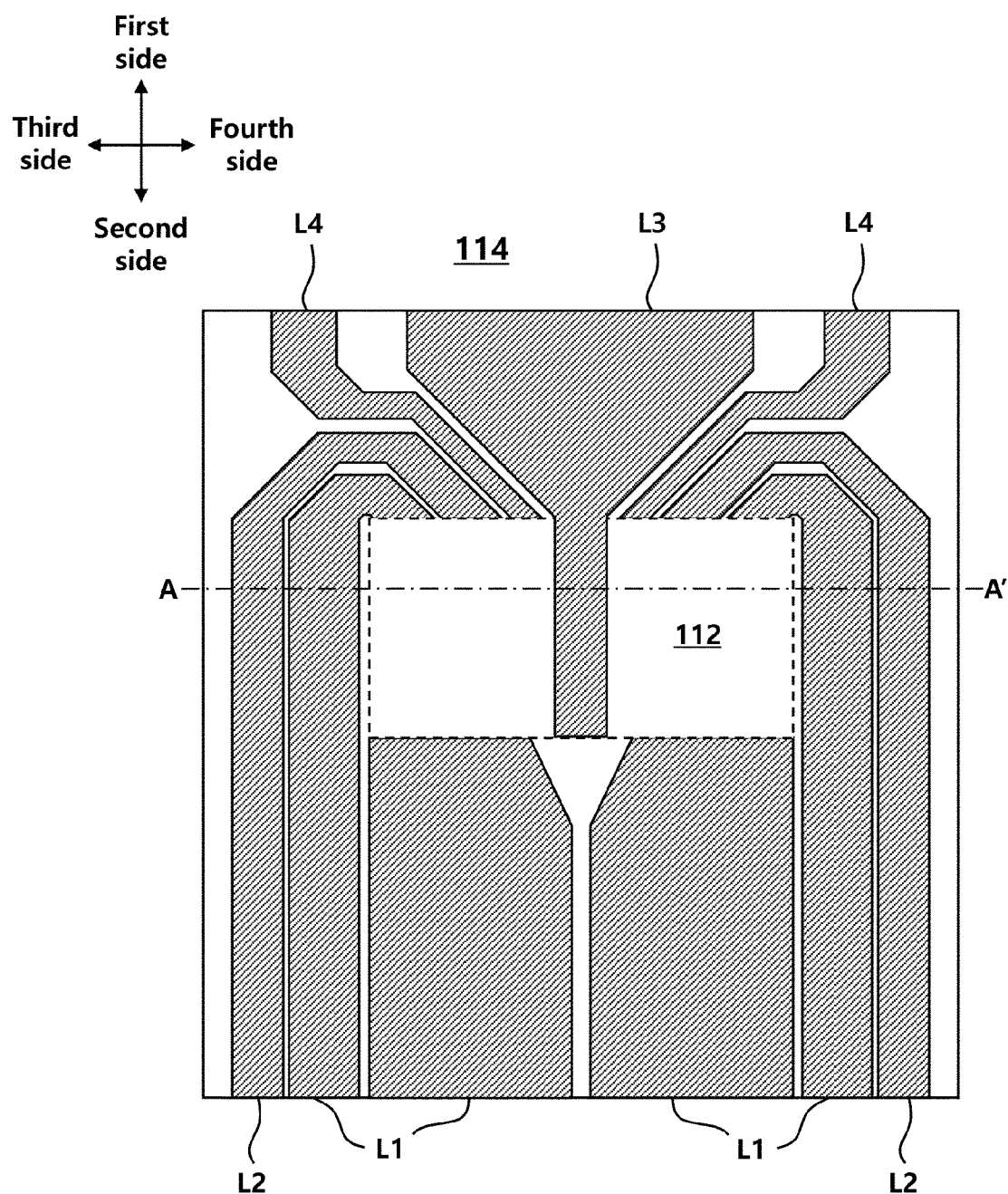
FIG. 3 is a pattern diagram of wires formed on a chip on film according to an embodiment.

FIG. 3 is a pattern diagram of wires formed on a chip on film according to an embodiment.

Referring to FIG. 3, the pixel driving wires L1 may be extended from the semiconductor chip 112 toward the second side in the chip on film 114. Since the pixel driving wires L1 are numerous, the pixel driving wires L1 may be extended from the second side, the third side, the fourth side, and parts of the first side of the semiconductor chip 112.

The touch driving wires L2 may be extended from the first side of the semiconductor chip 112 and surround the semiconductor chip 112 and the pixel driving wires L1 to be extended to the second side. The touch driving wires L2 may be disposed at the outskirts of the display panel in order not to overlap with the pixel driving wires L1.

The source communication wires L3 may be extended from the first side toward the semiconductor chip 112. The source communication wires L3 may be extended along a center line of the chip on film 114 and may be disposed to traverse from the first side to the second side under the semiconductor chip 112.

On the right and the left sides of the source communication wires L3, the readout communication wires L4 may be disposed. The readout communication wires L4 may be extended from the first side to the semiconductor chip 112.

Figure 4:
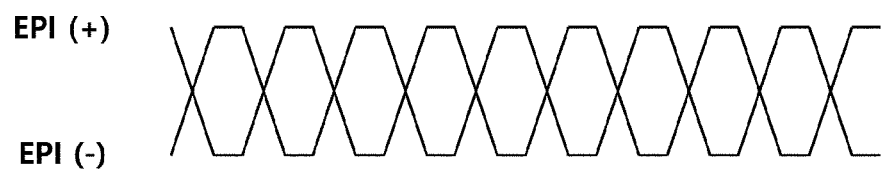
FIG. 4 is a waveform diagram of a source communication signal according to an embodiment.

FIG. 4 is a waveform diagram of a source communication signal according to an embodiment.

Referring to FIG. 4, a source communication signal may be a differential signal into which a clock is embedded. The source communication wires, through which source communication signals are transmitted, may comprise positive signal wires EPI(+) and negative signal wires EPI(−). The level of a source communication signal may be determined according to differential voltages of the two wires.

A source communication signal is a high speed differential signal, and therefore, it may create electro-magnetic interference in an adjacent circuit. According to an embodiment, the source communication wires, transmitting such source communication signals that might create electronic interference, are disposed outside the semiconductor chip, thereby minimizing the influence on the semiconductor chip.

Figure 5:
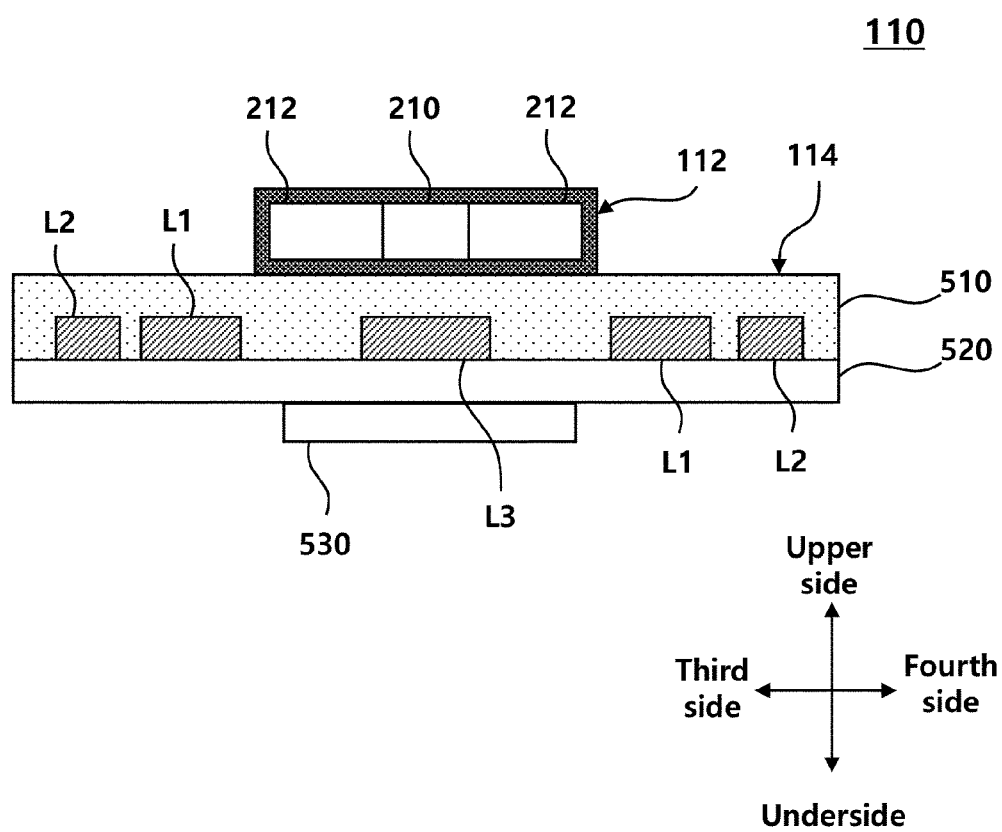
FIG. 5 is a cross-sectional diagram of a chip on film package obtained by sectioning the element in FIG. 3 in the A-A' part.

FIG. 5 is a cross-sectional diagram of a chip on film package obtained by sectioning the element in FIG. 3 in the A-A' part.

Referring to FIG. 5, the chip on film package 110 may comprise a semiconductor chip 112 and a chip on film 114.

The chip on film 114 may comprise a film layer 520, wires L1-L3, and an insulating layer 510.

The film layer 520 may provide a support substrate for the semiconductor chip 112.

The wires L1-L3 may be formed on the film layer 520 and covered with the insulating layer 510. The insulating layer 510 is removed in parts where the wires are connected with the pads of the semiconductor chip 112 and the parts of the wires L1-L3 are exposed so that they may be connected with the pads of the semiconductor 112.

Circuits including the readout logic circuit 210 and the readout circuits 212 may be disposed inside the semiconductor chip 112 and packaging members may enclose the outside of the semiconductor chip 112.

The wires L1-L3 may be formed on a same layer. Therefore, it is possible that the wires do not overlap in the routing.

Among the wires L1-L3, the source communication wires L3 may be disposed right under the semiconductor chip 112 and the other wires L1, L2 may be disposed under the third side and the fourth side of the semiconductor chip 112.

Although the source communication wires L3 transmit and receive embedded clock signals that might generate electromagnetic waves, since they are isolated from the semiconductor chip 112 by the insulating layer 510 and the packaging members, the semiconductor chip 112 may not greatly be affected by the electro-magnetic interference.

In the chip on film 114, a heat sink 530 may be attached on the opposite side of the semiconductor chip 112. Heat discharged outside the semiconductor chip 112 through the pads of the semiconductor chip 112 may be transmitted to the heat sink 530 through the wires L1-L3 and discharged outside.

As described above, the present disclosure allows an efficient routing of the wires disposed on the film of the chip on film package.

What is claimed is:

1. A chip on film package, having a first side and a second side opposite the first side, the chip on film package comprising:
 a semiconductor chip comprising a readout circuit configured to output a touch driving signal, a source channel circuit configured to output a pixel driving signal, a readout communication pad formed on the first side, and a source communication pad formed on the second side; and
 a chip on film on which (i) readout communication wire that is configured to transmit a readout communication signal and that is connected with the readout communication pad, and (ii) a source communication wire that is configured to transmit a source communication signal and that is connected with the source communication pad, are disposed, wherein
 the source communication wire is disposed to traverse an area, where the semiconductor chip is disposed, in a direction from the first side to the second side or a direction from the second side to the first side.

2. The chip on film package of claim 1, wherein the semiconductor chip further comprises a readout logic circuit configured to control the readout circuit and a source logic circuit configured to control the source channel circuit.

3. The chip on film package of claim 2, wherein the readout logic circuit is disposed on the first side of the chip on film package and the source logic circuit is disposed on the second side of the chip on film package.

4. The chip on film package of claim 1, wherein
 the semiconductor chip further comprises a gamma voltage pad disposed on the second side,
 the chip on film further comprises a gamma voltage wire that is configured to transmit a gamma voltage signal and that is connected with the gamma voltage pad,
 the gamma voltage wire is disposed to traverse the area, where the semiconductor chip is disposed in a direction from the first side to the second side or a direction from the second side to the first side.

5. The chip on film package of claim 1, wherein the chip on film further comprises a touch driving wire configured to transmit the touch driving signal to a touch electrode and a pixel driving wire configured to transmit the pixel driving signal to a pixel.

6. The chip on film package of claim 5, wherein the touch driving wire extends from a pad disposed on the first side, surrounds the semiconductor chip, and extends towards the second side.

7. The chip on film package of claim 5, wherein the readout communication wire, the source communication wire, the touch driving wire, and the pixel driving wire are formed on a same layer in the chip on film.

8. The chip on film package of claim 1, wherein
 the chip on film further comprises an insulating layer covering the readout communication wire and the source communication wire, and
 the semiconductor chip is disposed on the insulating layer.

9. The chip on film package of claim 8, wherein
 a source communication signal is a differential signal into which a clock is embedded, and
 the source communication wire comprises a wire for a positive differential signal and a wire for a negative differential signal.

10. The chip on film package of claim 1, wherein the semiconductor chip is disposed on an upper side of the chip on film and a heat sink is disposed on a lower side of the chip on film.

11. A semiconductor chip, which is configured to perform a communication using a readout communication wire of a chip on film and a source communication wire of the chip on film, both the readout communication wire and the source communication wire of the chip on film being extended from a first side of the semiconductor chip, and is configured to output a driving signal through a second side of the semiconductor chip, which is opposite to the first side, comprising:
 a readout communication pad disposed on the first side and configured to be connected with the readout communication wire of the chip on film;
 a source communication pad disposed on the second side and configured to be connected with the source communication wire of the chip on film, the source communication wire of the chip on film being extended from the first side to the second side in a state of being insulated from a lower surface of the semiconductor chip;
 a readout circuit disposed to be adjacent to the readout communication pad; and
 a source channel circuit disposed to be adjacent to the source communication pad.

12. The semiconductor chip of claim 11, further comprising a readout logic circuit configured to control the readout circuit and a source logic circuit configured to control the source channel circuit.

13. The semiconductor chip of claim 12, wherein the readout logic circuit is disposed on the first side in the semiconductor chip and the source logic circuit is disposed on the second side in the semiconductor chip.

14. The semiconductor chip of claim 11, wherein
 a source communication signal is configured to be transmitted and received through the source communication wire,
 the source communication signal is a differential signal into which a clock is embedded, and
 the source communication wire comprises a wire for a positive differential signal and a wire for a negative differential signal.

15. The semiconductor chip of claim 11, wherein the source channel circuit is configured to output a pixel driving signal through a wire extended toward the second side.

* * * * *